(12) United States Patent
Tao et al.

(10) Patent No.: US 6,230,237 B1
(45) Date of Patent: May 8, 2001

(54) CONTENT ADDRESSABLE MEMORY WITH AN INTERNALLY-TIMED WRITE OPERATION

(75) Inventors: Andrew J. Tao, Palo Alto; Peter D. Robertson, Fremont, both of CA (US)

(73) Assignee: 3Dfx Interactive, Inc., San Jose, CA (US)

( * ) Notice: Subject to any disclaimer, the term of this patent is extended or adjusted under 35 U.S.C. 154(b) by 0 days.

(21) Appl. No.: 09/150,513

(22) Filed: Sep. 9, 1998

(51) Int. Cl.[7] ........................................... G06F 12/02
(52) U.S. Cl. .............................. 711/108; 365/49; 365/50; 711/118; 711/150; 711/155; 711/167; 711/168; 711/169
(58) Field of Search ........................... 711/101–108, 150, 711/118, 155, 141–143, 167–169

(56) References Cited

U.S. PATENT DOCUMENTS

| | | | |
|---|---|---|---|
| 5,319,763 | * 6/1994 | Ho et al. | 711/108 |
| 5,329,629 | * 7/1994 | Horst et al. | 711/5 |
| 5,568,415 | * 10/1996 | McLellan et al. | 365/49 |
| 5,784,709 | * 7/1998 | McLellan et al. | 711/207 |
| 5,890,201 | * 3/1999 | McLellan et al. | 711/108 |
| 5,893,137 | * 4/1999 | Parks et al. | 711/108 |
| 6,041,405 | * 3/2000 | Green | 712/213 |

* cited by examiner

Primary Examiner—Than Nguyen
(74) Attorney, Agent, or Firm—Fenwick & West LLP

(57) ABSTRACT

A content addressable memory with an internally-timed write operation includes a data input for receiving a input word. Coupled to the data input are a plurality of storage registers comprising stored words. Each storage register includes a comparison circuit for comparing the stored word with the input word and producing therefrom a match output indicating a match when the stored word matches the input word, and indicating a miss when the stored word does not match the input word. Coupled to the storage registers is a miss detector for generating a miss signal responsive to each of the match outputs of the storage registers indicating a miss. Coupled to the miss detector is a write cycle circuit for writing the input word to at least one of the storage registers responsive to receiving the miss signal.

21 Claims, 5 Drawing Sheets

CONTENT ADDRESSABLE MEMORY WITH AN INTERNALLY-TIMED WRITE OPERATION

FIELD OF THE INVENTION

The present invention relates generally to digital memories, and more particularly, to a content addressable memory with an internally-timed write operation.

BACKGROUND ART

A Content Addressable Memory (CAM) is a memory unit that is used to compare an input data word to a number of stored data words. For each stored data word that matches the input data word, a match signal is asserted. If none of the stored data words matches the input data word, a read miss occurs and no match signal is asserted.

One example of a CAM application is a translation buffer that is used in a virtual memory system, where the input data word is a virtual address. If a match is found for the virtual address, the resulting match signal is used to select a corresponding physical address from an associated memory unit. If a read miss occurs, the virtual address is written to a CAM entry determined by a replacement rule, and the corresponding physical address is written to the associated memory unit. CAMs are also widely used in cache memory systems including, for example, fully associative caches.

As in the virtual memory system described above, the input data word is typically written to the CAM subsequent to a read miss. However, as conventionally implemented, the writing step is not automatic. External control logic is required to sense the read miss and generate a CAM write cycle in which the input data word is written to the CAM. Normally, this step requires one or more clock cycles after the read miss occurs. Thus, conventional approaches waste one or more clock cycles in updating the CAM with the input data word, which can have a cumulative effect over time.

Accordingly, what is needed is a CAM in which the input data word is automatically written responsive to a read miss without externally coupled control logic. What is also needed is a CAM in which the input data word is automatically written to one or more CAM entries in the same clock cycle as the comparison operation, using an internally-timed write operation.

SUMMARY OF THE INVENTION

The present invention is directed to a content addressable memory with an internally-timed write operation. In accordance with the present invention, a data input is provided for receiving an input word. Coupled to the data input are a plurality of storage registers comprising stored words. Each storage register includes a comparison circuit for comparing the stored word with the input word and producing therefrom a match output indicating a match when the stored word matches the input word, and indicating a miss when the stored word does not match the input word. Coupled to the storage registers is a miss detector for generating a miss signal responsive to each of the match outputs of the storage registers indicating a miss. Coupled to the miss detector is a write cycle circuit for writing the input word to at least one of the storage registers responsive to receiving the miss signal.

The present invention is also directed to a method for automatically updating a content addressable memory responsive to a read miss, including the steps of receiving an input word; comparing the input word with a plurality of stored words; and responsive to the input word matching none of the stored words, writing the input word to at least one storage register of the content addressable memory.

BRIEF DESCRIPTION OF THE DRAWINGS

FIG. 1A is a high-level block diagram of a CAM 100 in accordance with a preferred embodiment of the present invention;

FIG. 1B is a detailed block diagram of a CAM 100 in accordance with a preferred embodiment of the present invention;

FIG. 2A is a circuit diagram of a memory cell in accordance with a preferred embodiment of the present invention;

FIG. 2B is a circuit diagram of a timing control module in accordance with a preferred embodiment of the present invention; and FIG. 3 is a timing diagram showing operation of a preferred embodiment of the invention.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

Referring now to FIG. 1A, there is shown a high-level block diagram of a content addressable memory (CAM) 100 in accordance with a preferred embodiment of the present invention. Preferably, the CAM 100 has 32 storage registers of 16 bits each, although one skilled in the art will recognize that the number and size of the storage registers are not crucial to the invention. Likewise, 16 data inputs are provided, one for each bit in a data storage register, for specifying an input data word to the CAM 100. As shown in FIG. 1A, the 16 data inputs are labeled "addr" since the input data word is often an address, such as a virtual address.

The CAM 100 also includes 32 "hit" outputs, one for each data storage register. A "hit" output is asserted when the input data word is found in a corresponding data storage register of the CAM 100. Additionally, the CAM 100 includes 32 valid entry inputs, one for each data storage register, for selectively enabling the comparison operation on a row-by-row basis. For example, if a valid entry input is de-asserted, then no match can be found for the data storage register in the corresponding row. In FIG. 1A, the valid entry inputs are labeled "entry_val."

In one embodiment, the CAM 100 also includes a replacement entry input, labeled "rpl_entry," for specifying which data storage register will be overwritten during a write operation. The replacement entry input preferably comprises 5 bits for encoding the row number of the data register to be updated. In a preferred embodiment, the replacement entry input is generated externally using a conventional allocation mechanism such as Least Recently Allocated (LRA) or the like. In one embodiment, the write operation can be prohibited entirely by de-asserting a write enable signal, designated "wr_en," which prevents updates of the CAM 100 when a read miss occurs. Finally, a clock signal is provided for driving the operation of the CAM 100.

Referring now to FIG. 1B, there is shown a detailed block diagram of a CAM 100 in accordance with a preferred embodiment of the present invention. Preferably, the CAM 100 includes a data array 102 which includes the 32 data storage registers described above. A description of the individual cells of the data array 102 will be provided in greater detail hereafter with respect to FIG. 2.

Figure 1A:
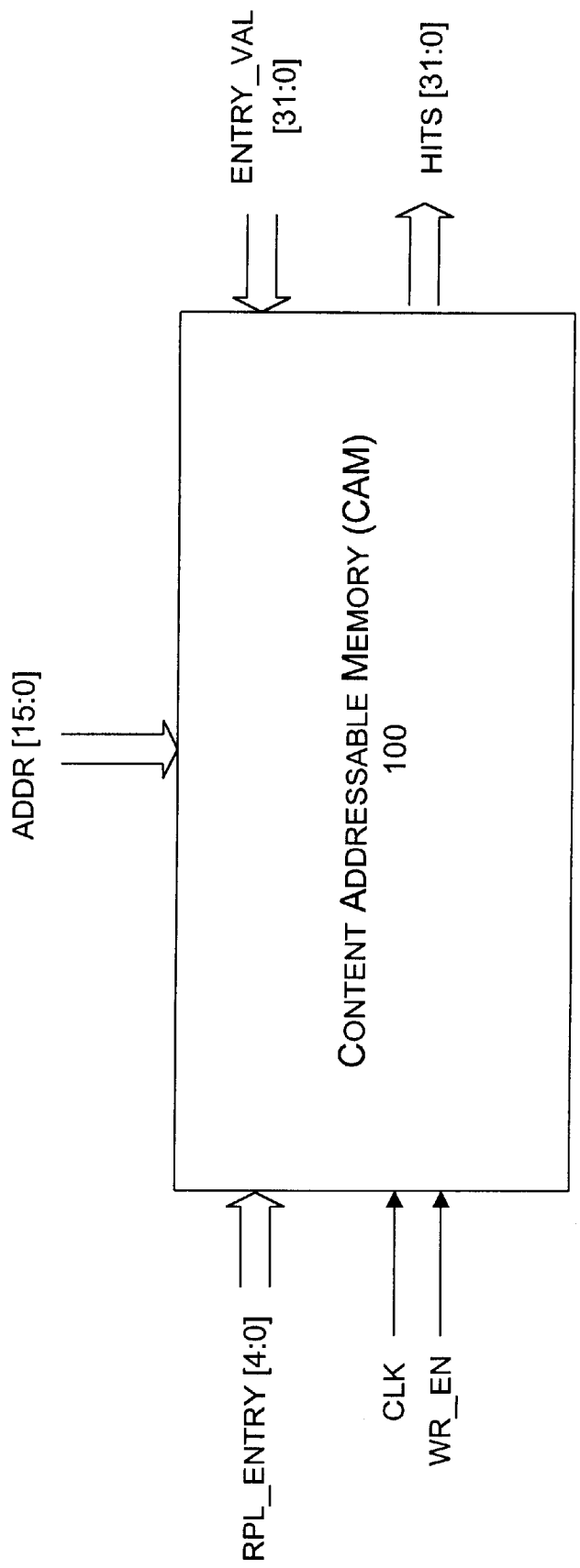
Figure 1B:
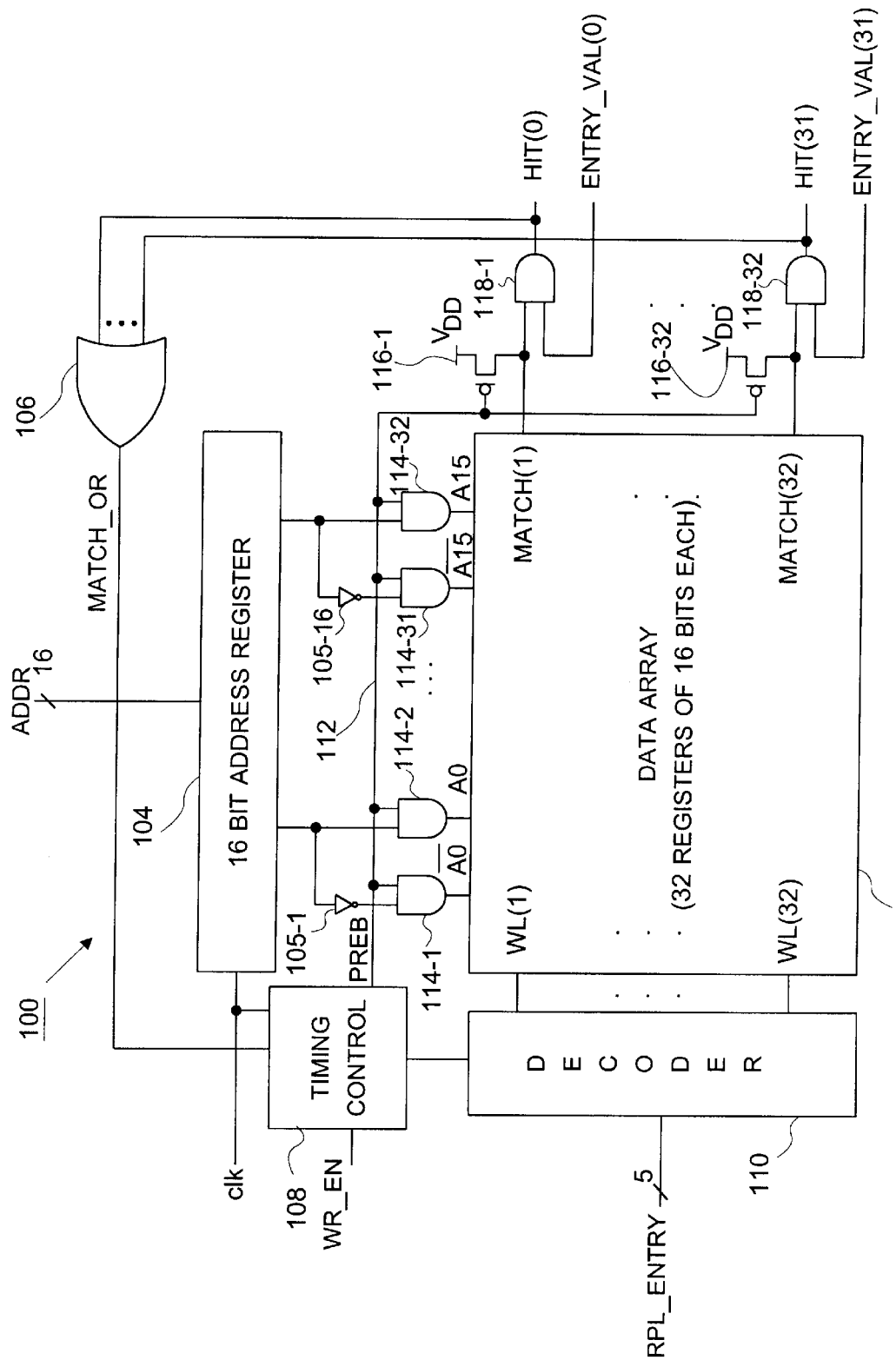

In one embodiment, the data array 102 includes 32 data inputs, 16 of which are received from a 16 bit address register 104. The other 16 inputs are also received from register 104 via inverters 105-1 through 105-16, which provide an inverted version of the same data when "preb" is high. In FIG. 1B, the foregoing data inputs are labeled "A0" through "A15" and "A0" through "A15" respectively. Throughout the following description, overbars and underbars are synonymous.

In a preferred embodiment, data array 102 includes 32 control inputs labeled "WL(1)" through "WL(32)" for selecting the data register of array 102 that will be overwritten during a write operation. In one embodiment, when a pulse is received on a "WL" input, the "addr" input data is written to the corresponding data register of array 102.

The data array 102 also includes 32 "match" outputs for indicating which, if any, of the registers of array 102 match the data stored in register 104. In FIG. 1B, the "match" outputs are labeled "match(1)" through "match(32)." In a preferred embodiment, the "match" outputs of data array 102 are coupled to a 32 input OR gate 106, which generates a "match or" signal for indicating that at least one match was found. One skilled in the art will recognize that an inverted "match or" signal indicates a read miss. Thus, in one embodiment, OR gate 106 functions as a miss detector. In an alternative embodiment, the miss detector may be implemented as a wired-OR gate coupled with an inverter.

In one embodiment, the "match_or" output of the OR gate 106 is received by a timing control module 108, the operation of which is described in greater detail with reference to FIG. 2B below. A falling edge of the "match or" signal indicates that a read miss occurred, which causes timing control module 108 to generate a write pulse to a decoder 110. The write pulse is sent by decoder 110 to the appropriate "WL" input of the data array 102 based on the value of "rpl_entry." Preferably, timing control module 108 also includes inputs for the write enable ("wr_en") signal, as well as a signal from an external clock. Thus, in one embodiment, timing control module 108 functions as a write cycle circuit.

In a preferred embodiment, timing control module 108 is also used to generate a precharge pulse ("preb") at the beginning of the operational cycle of the CAM 100 in order to drive each of the "match" outputs of data array 102 high. As shown in FIG. 1B, timing control module 108 is coupled to a precharge line 112. Preferably, the precharge line 112 is coupled to the 32 data inputs of array 102 via 32 AND gates 114-1 through 114-32. One skilled in the art will recognize that when the precharge line 112 is low, each of the 32 data inputs of array 102 are driven low by the AND gates 114.

In addition, the precharge line 112 is preferably coupled to the 32 "match" outputs of data array 102 via transistors 116-1 through 116-32. In one embodiment, transistors 116 are conventional FETs, which are widely known in the art. Preferably, transistors 116 are configured to drive the "match" lines of array 102 high when the signal on precharge line 112 is low. For example, the source of a transistor 116 may be coupled to $V_{DD}$, the gate to the precharge line 112, and the drain to the "match" output. As described hereafter with respect to FIG. 3, the reason for precharging the "match" lines is to create a falling edge in the "match_or" signal if a read miss (no match) occurs. Thereafter, the falling edge causes the timing control module 108 to issue a write pulse to decoder 110.

As noted earlier, the 32 valid entry ("entry_val") inputs are provided in order to selectively disable comparison on a row-by-row basis. As shown in FIG. 1B, the "entry val" inputs are coupled to the "match" outputs of data array 102 via 32 AND gates 118-1 through 118-32. One skilled in the art will recognize that when an "entry_val" input is de-asserted, the corresponding "hit" output is also de-asserted. Thus, a read miss can be forced during a given clock cycle by de-asserting each of the "entry_val" inputs. This process can be useful, for example, for initializing the CAM 100 regardless of its contents.

Figure 2A:
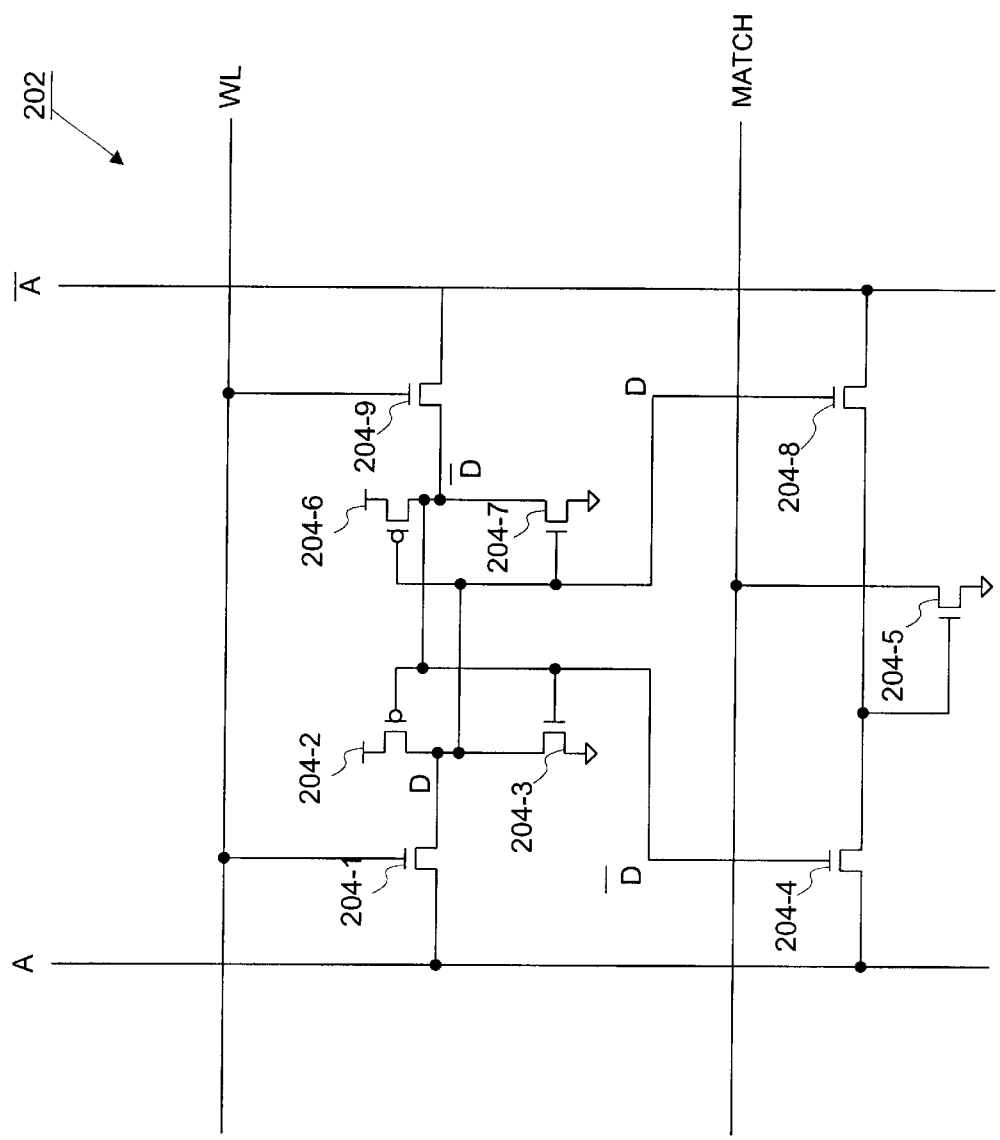

Referring now to FIG. 2A, there is shown a circuit diagram of an individual cell 202 of data array 102 in accordance with a preferred embodiment of the present invention. Preferably, each cell 202 is used to store one bit of data. Thus, in a preferred embodiment, a row of cells (or register) of data array 102 comprises sixteen cells 202. Each cell comprises a plurality of transistors 204-1 through 204-9, as well as a number of data and control lines, including "A/A" lines, "D/D" lines, a "WL" line, and a "match" line. Preferably, transistors 204-1 through 204-9 are implemented using CMOS technology.

In a preferred embodiment, the "A/A" lines are used to assert a single bit of input data to cell 202, and correspond to one of the 16 data input pairs of array 102. By means of the transistors 204, cell 202 stores a single bit of data as indicated by the "D/D" lines. Preferably, each cell 202 is a comparator circuit as well as a data storage unit. Thus, if the stored data bit represented by "D/D" does not match "A/A" input data, the corresponding "match" line is pulled low. It should be noted that, at the beginning of each cycle, "A/A" is driven low by the precharge pulse ("preb"), which allows the "match" line to be precharged high. Thus, a falling edge occurs in the "match_or" signal when the precharge pulse is removed, if there is no match from the data array.

As noted earlier, the "WL" line of each cell 202 is coupled to decoder 110, which, during a write operation, selects one of the "WL" lines responsive to the value of "rpl_entry." For the cell 202 that is selected, a pulse is received via the "WL" line, which causes the stored data bit of "D/D" to be replaced by the input data bit of "A/A."

Figure 2B:
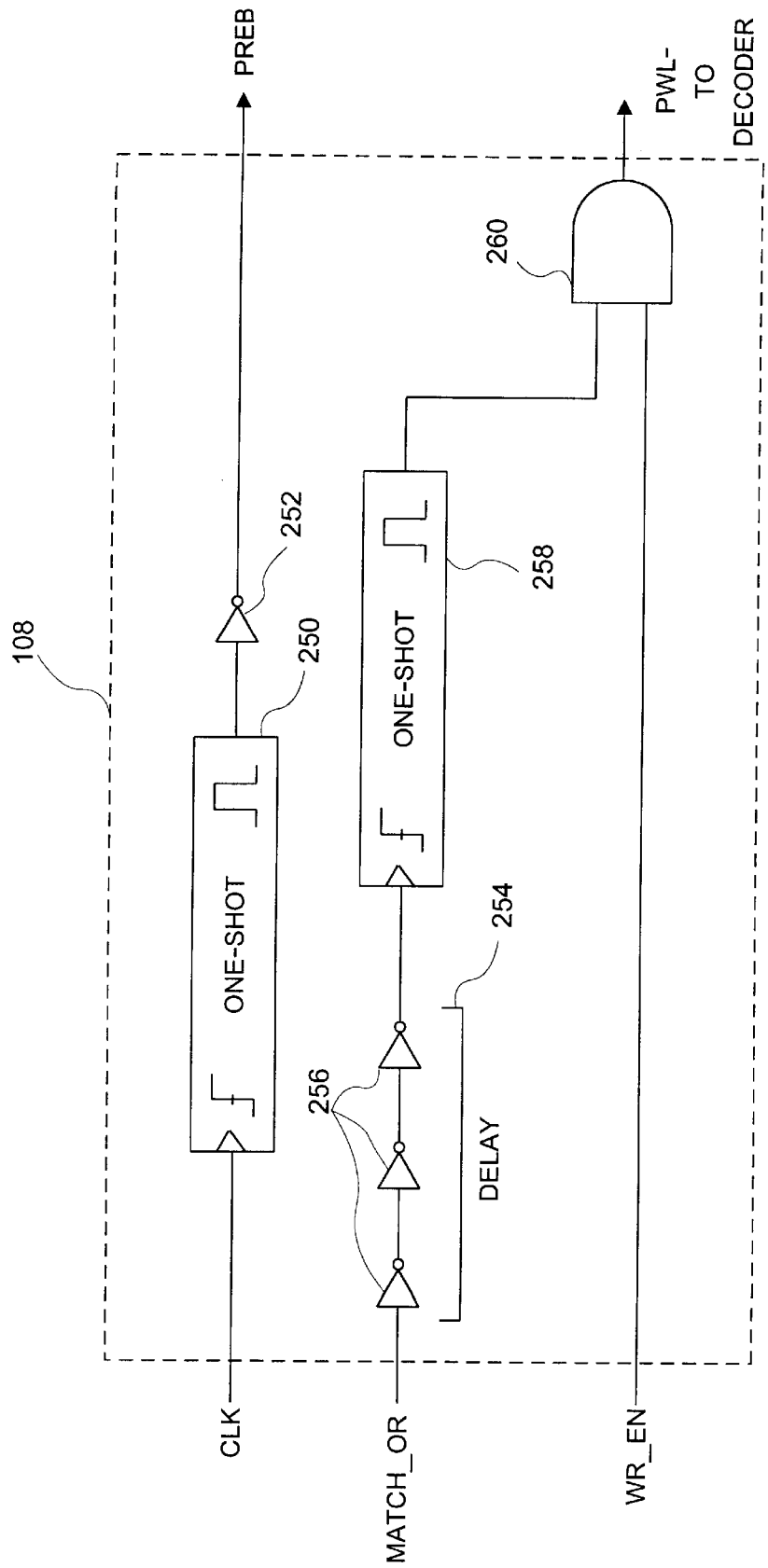

Referring now to FIG. 2B, there is shown a timing control module 108 in accordance with a preferred embodiment of the present invention. Preferably, timing control module 108 receives a clock signal, a "match or" signal, and a "wr_en" signal. The clock signal is coupled to a one shot 250, which is a conventional circuit for converting the rising edge of a signal into a pulse. Preferably, the one shot 250 is coupled to an inverter 252 to generate the "preb" signal on the precharge line 112. Thus, the "preb" signal is an inverted pulse that occurs with the rising edge of each clock cycle.

In a preferred embodiment, the "match_or" signal is coupled to a delay circuit 254, in order to ensure that all of the "match" lines are in the correct state before issuing a write pulse. For example, if the previous cycle was a write, then a delay helps get the current match lines in the correct state before the next write. This is because a write can overlap into the next write cycle. A variety of delay circuits 254 could be used within the scope of the present invention. For example, in a preferred embodiment, the delay circuit 254 comprises three inverters 256-1 through 256-3. Preferably, an odd number of inverters are used, in order to convert the falling edge of the "match_or" signal into a rising edge.

In one embodiment, the output of the delay circuit 254 is coupled to a one shot 258, so that the falling edge of the "match_or" signal is converted into a write pulse. Thus, when a read miss occurs in the data array 102, a write pulse is generated by the one shot 258. Preferably, the output of the one shot 256 is coupled to an input of an AND gate 260, which, itself, is coupled to the "PWL-" input of decoder 110. Also coupled to an input of the AND gate 260 is the "wr_en" signal. Thus, if the "wr_en" signal is de-asserted, no write pulse will be sent to decoder 110, and updating of the CAM 100 is effectively disabled.

Figure 3:
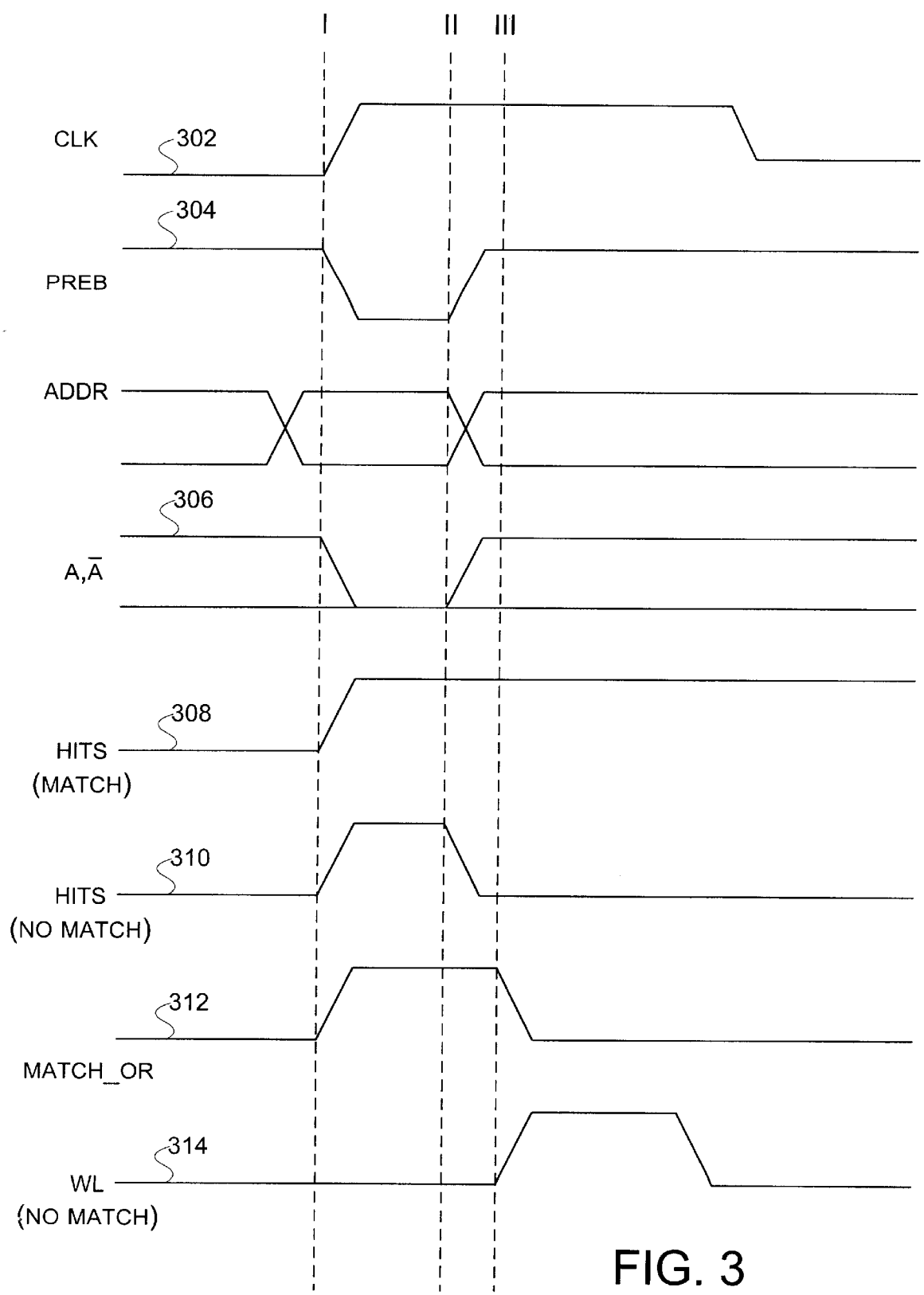

Referring now to FIG. 3, there is shown a timing diagram of the operation of a preferred embodiment of the CAM 100 including time indexes I–III, which are delineated by vertical dashed lines. As shown at 302, a clock signal is received by the CAM 100 from an external clock source. At time index I, the rising edge of the clock signal causes timing control module 108 to generate the inverted precharge pulse as shown at 304. As explained with reference to FIG. 1B, the precharge pulse has two effects. First, as shown at 306, the "A" and "A" inputs of each cell 202 of data array 102 are driven low. Second, as shown at 308 and 310, the "match" outputs of data array 102 are precharged high, also driving the "match_or" signal high as shown at 312.

At time index II, the precharge pulse is removed, which has one of two effects depending on whether a read miss (no match) occurs. First, as shown at 308, if at least one match is found during the comparison, a "match" signal is asserted at time index II. Thus, the "match_or" signal will also remain high.

However, as shown at 310, if no match is found (a read miss), each of the "match" signals are driven low when the precharge pulse is removed at time period II. Consequently, as shown at 312, the "match_or" signal will include a falling edge at time index III, which will cause timing control module 108 to generate the "WL" pulse to decoder 110 as shown at 314. The input data word is then written to the row of data array 102 selected by "rpl_entry." Thus, the CAM 100 is automatically updated on a read miss, without the requirement for a separate write operation or external write cycle logic.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

What is claimed is:

1. A content addressable memory device comprising:
   a data input for receiving an input word;
   a plurality of storage registers, coupled to the data input, each storage register comprising:
   a stored word, and
   a comparison circuit to compare the stored word with the input word and produce a match output indicating a match when the stored word matches the input word, and to indicate a miss when the stored word does not match the input word;
   a miss detector, coupled to the storage registers, to generate a miss signal in response to each of the match outputs of the storage registers indicating a miss; and
   a write cycle circuit, coupled to the miss detector, to write the input word to at least one storage register in response to a miss signal;
   wherein the input word is written to at least one storage register during a clock cycle in which the input word is compared with the stored word.

2. The device of claim 1, wherein the miss detector is selected from the group consisting of an OR gate and a wired-OR gate.

3. The device of claim 1, further comprising:
   a plurality of write enable inputs, each write enable input being coupled to a storage register, wherein the input word is written to each storage register in which a write enable signal is asserted on a corresponding write enable input.

4. The device of claim 3, further comprising:
   a decoder including a plurality of outputs and replacement entry input, wherein the plurality of outputs are coupled to the write enable inputs of the storage registers, and the replacement entry input determines which of the storage registers will be overwritten during a write cycle.

5. The device of claim 1, further comprising:
   a plurality of validity signals, each validity signal being coupled to the comparison circuit of a storage register, whereby assertion of the validity signal enables the comparison circuit to produce a match output indicating a match.

6. The device of claim 1, further comprising:
   a write cycle delay circuit for triggering the write cycle circuit after a predetermined delay time.

7. The device of claim 1, further comprising:
   a precharge circuit for forcing each of the match outputs of the plurality of storage registers to produce an indication of a match during a portion of each clock cycle.

8. A content addressable memory device comprising:
   a data input for receiving an input word;
   a plurality of storage registers, coupled to the data input, each storage register comprising:
   a stored word, and
   a comparison circuit to compare the stored word with the input word and produce a match output indicating a match when the stored word matches the input word, and to indicate a miss when the stored word does not match the input word;
   a miss detector, coupled to the storage registers, to generate a miss signal in response to each of the match outputs of the storage registers indicating a miss; and
   a write cycle circuit, coupled to the miss detector, to write the input word to at least one storage register in response to a miss signal;
   wherein the input word is written to at least one storage register with a write pulse asynchronous to a clock signal.

9. The device of claim 8, wherein the miss detector is selected from the group consisting of an OR gate and a wired-OR gate.

10. The device of claim 8, further comprising:
    a plurality of write enable inputs, each write enable input being coupled to a storage register, wherein the input word is written to each storage register in which a write enable signal is asserted on a corresponding write enable input.

11. The device of claim 5, further comprising:
    a decoder including a plurality of outputs and replacement entry input, wherein the plurality of outputs are coupled to the write enable inputs of the storage registers, and the replacement entry input determines which of the storage registers will be overwritten during a write cycle.

12. The device of claim 8, further comprising:

a plurality of validity signals, each validity signal being coupled to the comparison circuit of a storage register, whereby assertion of the validity signal enables the comparison circuit to produce a match output indicating a match.

13. The device of claim 8, further comprising:

a write cycle delay circuit for triggering the write cycle circuit after a predetermined delay time.

14. The device of claim 8, further comprising:

a precharge circuit for forcing each of the match outputs of the plurality of storage registers to produce an indication of a match during a portion of each clock cycle.

15. A content addressable memory device comprising:

a data input for receiving an input word;

a plurality of storage registers, coupled to the data input, each storage register comprising:
  a stored word, and
  a comparison circuit to compare the stored word with the input word and produce a match output indicating a match when the stored word matches the input word, and to indicate a miss when the stored word does not match the input word;

a miss detector, coupled to the storage registers, to generate a miss signal in response to each of the match outputs of the storage registers indicating a miss; and a write cycle circuit, coupled to the miss detector, to write the input word to at least one storage register in response to a miss signal;

wherein the miss signal includes signal comprising a falling edge, and the write cycle circuit comprises a one-shot, wherein the one-shot converts the falling edge of the miss signal into a write pulse for writing the input word to at least one storage register.

16. A method for automatically updating a content addressable memory responsive to a read miss, the method comprising the steps of:

receiving an input word;

comparing the input word with a plurality of stored words; and responsive to the input word matching none of the stored words, writing the input word to at least one storage register;

wherein the input word is written to the at least one storage register during a clock cycle in which the input word is compared with the stored word, and the input word is written to the at least one storage register asynchronously with a clock signal.

17. The method of claim 16, wherein the comparing step comprises:

generating a match output indicating a match for each stored word that matches the input word, and indicating a miss for each stored word that does not match the input word; and responsive to each match output indicating a miss, generating a miss signal.

18. The method of claim 16, wherein the writing step comprises: responsive to a miss signal, generating a write pulse for storing the input word in at least one of the plurality of storage registers.

19. The method of claim 16, wherein the input word is written to each storage register in which a write enable signal is asserted on a corresponding write enable input.

20. The method of claim 16, further comprising:

coupling a plurality of validity signals with the match outputs, whereby assertion of the validity signal enables the match outputs to indicate a match.

21. The method of claim 20, comprising the initial step of:

precharging each of the match outputs to produce an indication of a match.

* * * * *